United States Patent [19]

Diener et al.

[11] Patent Number: 5,614,250
[45] Date of Patent: Mar. 25, 1997

US005614250A

[54] COATED FILLER AND USE THEREOF

[75] Inventors: Carl E. Diener, Binghamton; Ashit A. Mehta, Vestal; Ralph S. Paonessa, Endwell; Eugene R. Skarvinko, Binghamton; David W. Wang, Vestal, all of N.Y.

[73] Assignee: International Business Machines Corporation, Armonk, N.Y.

[21] Appl. No.: 468,143

[22] Filed: Jun. 6, 1995

Related U.S. Application Data

[62] Division of Ser. No. 272,658, Jul. 11, 1994, abandoned, which is a continuation of Ser. No. 998,132, Dec. 29, 1992, abandoned.

[51] Int. Cl.$^6$ .................. B05D 3/02; B05D 5/12
[52] U.S. Cl. .................. 427/96; 427/379; 427/387; 427/388.4
[58] Field of Search .................. 427/96, 379, 387, 427/331, 289, 377, 388.4

[56] References Cited

U.S. PATENT DOCUMENTS

| | | | |
|---|---|---|---|
| 2,940,947 | 6/1960 | Welch et al. | 260/29.1 |
| 3,630,982 | 12/1971 | Matherly | 260/29.1 SB |
| 4,087,394 | 5/1978 | Concannon | 260/29.6 F |
| 4,335,180 | 6/1982 | Traut | 428/303 |
| 4,529,774 | 7/1985 | Evans et al. | 524/860 |
| 4,849,284 | 7/1989 | Arthur et al. | 428/325 |
| 5,055,342 | 10/1991 | Markovich et al. | 428/137 |
| 5,061,548 | 10/1991 | Arthur et al. | 428/209 |
| 5,061,779 | 10/1991 | Wang | 528/98 |
| 5,100,722 | 3/1992 | Nakamura et al. | 428/263 |
| 5,120,339 | 6/1992 | Markovich et al. | 65/3.1 |
| 5,149,590 | 9/1992 | Arthur et al. | 428/421 |
| 5,194,326 | 3/1993 | Arthur et al. | 428/325 |
| 5,354,611 | 10/1994 | Arthur et al. | 428/325 |
| 5,384,181 | 1/1995 | Arthur et al. | 428/195 |

FOREIGN PATENT DOCUMENTS

| | | |
|---|---|---|
| 382557 | 8/1990 | European Pat. Off. . |
| 512401 | 11/1992 | European Pat. Off. . |
| 3220239 | 9/1991 | Japan . |

OTHER PUBLICATIONS

Printed Circuits Hand Book, Clyde F. Coombs, Jr., pp. 32.2–32.3, McGraw-Hill, 1988.

*Primary Examiner*—Michael Lusignan
*Assistant Examiner*—Erma Cameron
*Attorney, Agent, or Firm*—Pollock, Vande Sande & Priddy

[57] ABSTRACT

Fillers coated with a fluorosilane coating are provided as well as compositions containing the coated fillers. Compositions are especially suitable for substrates for printed circuit boards and cards.

13 Claims, No Drawings

COATED FILLER AND USE THEREOF

DESCRIPTION

This is a divisional application of Ser. No. 08/272,658, filed on Jul. 11, 1994, which is a continuation of Ser. No. 07/998,132, filed Dec. 29, 1992, which is now abandoned.

TECHNICAL FIELD

The present invention is concerned with certain fillers having a fluorosilane coating thereon and to polymeric compositions containing the fillers, and especially compositions containing fluorinated polymeric material as the binder. The compositions exhibit enhanced ductility, low dielectric constant, along with improved moisture and alkali resistance.

In addition, the present invention is concerned with methods for fabricating layers of the composition that are suitable for substrates for printed circuit boards and cards. The compositions of the present invention are especially suitable for providing substrates that contain vias therein obtained by laser drilling, and/or mechanical drilling and/or punching.

BACKGROUND ART

In the manufacture of printed circuit boards and cards, a dielectric sheet material is employed as the substrate. A conductive circuit pattern is provided on one or both of the major surfaces of the substrate.

As described in, for instance, U.S. Pat. No. 3,689,991 and Tummala et al., "Micro Electronics Packaging Handbook," pages 409–435, Van Nostrand Reinhold, flexible polymeric films can be used as carriers in the packaging of semiconductor chips such as in the so-called TAB (Tape Automated Bonding) procedure. To date, the primary polymeric material employed for such has been polyimides. One procedure used for employing polyimide as the dielectric and/or circuit carrier for flexible circuits involves spray coating or roller coating polyamic acid onto a sheet of metal (such as stainless steel or aluminum). The film is then cured or imidized, resulting in a film which is fully or substantially fully cured. The metal which the polyimide is on can be imaged, removed or maintained. On top of the polyimide, three layers of metal are generally deposited such as by either evaporation or sputtering. The metal conductors are chromium or nickel, followed by a layer of copper, followed by a layer of chromium or nickel. By means of photolithographic operations, this metal is imaged into circuits. Depending on the Use of the circuit, the cured polyimide may or may not be imaged either before or after the formation of the circuit.

In addition, flexible circuits have also been fabricated using free-standing polymeric films such as polyimides onto which metal layers are vacuum-deposited, laminated or glued. The metal circuit pattern is defined by using a photoresist pattern to either act as a plating mask or act as a mask for subtractive etching of the metal layer. Via holes in the polymer film can be made by drilling, punching or etching.

In addition, the selective formation of holes in insulating polymeric films to provide openings or vias therein is important for various electronic uses of dielectric polymeric films. For instance, in the packaging of semiconductor chips, polymers such as polyamic acid films have often been coated onto substrates and then cured either chemically or thermally.

In a number of these situations it is necessary to form vias into the polymeric layer to allow for electrical connections to be made between the different layers of metallurgy. In order that the interconnection be as accurate as possible, it is necessary that the polymeric films resist distortion of the desired pattern and withstand attack from other wet processing chemicals.

For instance, in the formation of multi-layer substrates for mounting chips, it is necessary to electrically connect some of the conductors in the upper or second layer of metallization to some of the conductors on the lower or first layer of metalization. In order to do so, the polymeric material must have vias formed therein to allow for metal connection between the upper and lower levels of metallization in connection to a chip and/or board.

Fluorinated polymeric materials such as polytetrafluoroethylene and polytrifluoromonocholoroethylene are attractive candidates for advanced electronic packaging applications because of their very low dielectric constants, excellent stability, low solvent/moisture absorption and excellent thermal stability. However, the fluorinated polymeric materials have very poor coefficient of thermal expansion and therefore must include modifiers therein to achieve a coefficient of thermal expansion suitable for use as a substrate for electronic devices.

It has been suggested to provide compositions of polytetrafluoroethylene materials with certain fillers such as glass or ceramic microparticles to achieve improved dimensional stability and low thermal expansion coefficient (CTE) without a concomitant loss in the low dielectric properties of the polymeric material. In addition, for the most part these composites also include glass fibers therein. Along these lines, see U.S. Pat. Nos. 4,335,180 and 4,849,284.

However, the compositions suggested in the above prior art require an amount of filler in excess of the polymeric material and/or the presence of fibers in addition to the relatively small particle size fillers. The fillers employed have mean particle diameters of 10–15 microns and films formed therefrom are a minimum of 38 microns thick.

The composites suggested in the above prior art are not entirely satisfactory since difficulties are encountered in fabricating vias therein and laser drilling cannot be employed readily because of the relatively large size of the particles. Moreover, when glass fibers are present such tend to remain in the through holes.

More recently, U.S. Pat. No. 5,055,342 to Markovich et al. and assigned to International Business Machines Corporation, the assignee of the present application, discloses a composition that exhibits a low dielectric constant along with a low coefficient of thermal expansion and which is relatively easy to process. The compositions disclosed therein contain a fluorinated polymeric material and a filler whereby the filler has a mean particle size of no greater than about 7 microns. The amount of the fluorinated polymer is about 50 to about 90% by weight and the amount of the filler is about 50 to about 10% by weight. These amounts are based upon the total of the fluorinated polymeric material and filler in the composition.

Although these compositions provide low dielectric constant, high temperature stability and low moisture absorption, such compositions could stand improvement in resistance to moisture, alkali and process baths.

SUMMARY OF INVENTION

The present invention is concerned with a filler that is coated with a fluorosilane. More particularly, the filler is silica and/or quartz. The coated fillers when employed in a composition containing a fluorinated polymeric material, provide a composition that exhibits enhanced ductility, low dielectric constant, along with improved moisture and alkali resistance. The amount of the fluorinated polymer is about 50 to about 90% by weight and the amount of filler is about 50 to about 10% by weight. These amounts are based upon the total of the fluorinated polymeric material and filler in the composition.

The present invention is also concerned with a method for fabricating a layer containing the fluorinated polymeric material. In particular, the process of the present invention includes obtaining the composition containing the fluorinated polymeric material and filler disclosed above and then applying the composition to a substrate. The composition is heated to a temperature of about 350° to about 400° C. to thereby fuse the composition. Typically, the composition is first preheated to temperatures up to about 320° C. to remove volatile constituents prior to the heating to fuse the composition.

Another aspect of the present invention is concerned with a circuitized substrate that contains a dielectric substrate exhibiting a low dielectric constant and low coefficient of thermal expansion and containing a fluorinated polymeric material and filler as disclosed above and having a metallic layer disposed on at least a portion of at least one of the major surfaces of the substrate.

BEST AND VARIOUS MODES FOR CARRYING OUT INVENTION

The fillers employed pursuant to the present invention are silica and/or quartz. The fillers can be solid particles, or in hollow microsphere form, or sol-gel spheres.

The fillers employed pursuant to the present invention typically exhibit a mean particle size of about 7 microns or less. According to more typical aspects of the present invention, the particle size distribution is about 0.1 to about 40 microns preferably about 2 to about 5 microns. The particle size is preferably no smaller than about 0.1 microns.

Pursuant to the present invention, the fillers are precoated with a fluorosilane to thereby achieve the improved properties discussed herein. The amount of fluorosilane is typically about 0.2 to about 10% by weight, and preferably about 0.2 to about 5% by weight based upon the weight of the filler.

The fluorosilane contains reactive or leaving groups such as alkoxy groups and halo groups that are reactive with reactive groups on the filler such as hydroxy groups on the filler. Typical alkoxy groups contain 1 to 8 carbon atoms and preferably 1 to 4 carbon atoms and include methoxy, ethoxy and propoxy.

Examples of some suitable fluorosilanes are as follows:
1H,1H,2H,2H-Perfluorooctyl triethoxysilane of the formula:

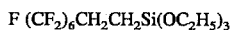

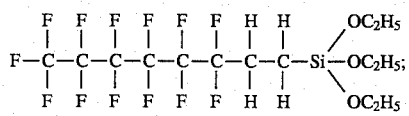

1H, 1H, 2H, 2H-Perfluoroalkyl triethoxysilanes of the formula:

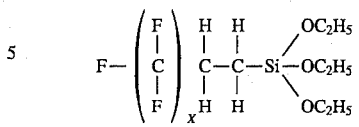

wherein X=6,8,10;
(Tridecafluoro-1,1,2,2,-Tetrahydrooctyl)-1-dimethylchlorosilane of the formula:

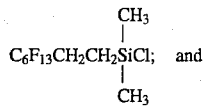

and
(3,3,3-Trifluoropropyl) trimethoxysilane of the formula

The filler can be precoated with the fluorosilane by any convenient coating procedure. For example, the silane can be dissolved in a solvent such as an alcohol, followed by adding the filler to the solution and then drying to obtain the desired filler.

Commercially available fillers that Can be coated pursuant to the present invention include L207 NOVACUP available from Malvern Mineral Co. (a crystalline silica having an average particle size of 3.45 microns), AEROSIL 200 (a fumed silica obtainable from Degussa Corporation and having an average particle size of 23 nanometers or a surface area of about 175 to about 225 square meters per gram and having a $SiO_2$ content greater than 99.8%) and SDT-60 hollow microspheres obtainable from Grace Syntactic and having an average particle size of 7 um. Other Suitable fillers include MIN-U-SIL from U.S. Silica Co. having an average particle size of about 1.1 microns, and synthetic silica ($SiO_2$ 99.9%) from Cerac Corporation having an average particle size of about 2 microns and QUSO G 135 available from DeGussa and being a precipitated silica, having about 98% $SiO_2$, surface area of about 180 m²/g, average agglomerate size of 2 microns; PQ 4910 silica, a fused amorphous silica having an average particle size of 2.1 microns and surface area of 9.2 m²/gm.; and GEL-TECH spherical silica, a sol-gel having a particle size of 1.5 micron and surface area of 2.3 m²/gm. Certain of the fillers such as QUSO G135 also act as antisettling agents.

The fluorinated polymeric materials employed pursuant to the present invention are well-known and include such commercially available polyfluoroalkylene materials as polytetrafluoroethylene, copolymers of tetrafluorothylene and hexafluoropropylene, copolymers of tetrafluoroethylene and perfluoro-2-2-dimethyl-1,3 dioxide, polytrifluorochloroethylene, copolymers of tetrafluoroethylene with for example olefins such as ethylene; copolymers of trifluoromonochloroethylene with for example olefins such as ethylene, and polymers of perfluoroalkyl vinyl ether.

Some commercially available fluorinated polymeric materials employed pursuant to the present invention include those available under the trade designation TEFLON PTFE (polymers of tetrafluoroethylene), TEFLON FEP (perfluorinated ethylene-propylene copolymers); TELFON PFA; TEFZEL (copolymer of tetrafluoroethylene and ethylene); HALAR (copolymer of chlorotrifluoroethylene and ethylene); KEL-F (polymer of chlorotrifluoroethylene); HFB-430

(polymer of chlorotrifluoroethylene) and TEFLON AF (copolymer of tetrafluoroethylene and at least 65 mole % of perfluoro-2,2-dimethyl-1,3(dioxide). The preferred fluorinated polymeric material is polytetrafluoroethylene.

It is desirable that the compositions of the present invention be free from fibrous fillers.

It is preferred that the amount of polytetrafluoroethylene employed is equal to or greater than the amount of the filler and preferably the compositions contain about 50 to about 90% by weight and most preferably about 50 to about 70% by weight of the fluorinated polymeric material and correspondingly about 50 to about 10% by weight and preferably about 50 to about 30% by weight of the filler. These amounts are based upon the total of the filler and fluorinated polymeric material in the composition (dry bases).

If desired, the compositions of the present invention can include surface active agents such as non-ionic surfactants and antisettling agents. Such are normally employed in amounts of about 0.1 to about 10% by weight of the total composition and preferably about 0.5 to about 6% by weight. In fact, commercially available fluorinated polymer preparations include a surfactant.

In addition, according to preferred aspects of the present invention, during processing, the pH of the composition should be about 8 to about 11, and most preferably about 9 to about 9.5 in order to facilitate the processing. The pH can be controlled by adding a suitable base such as ammonium hydroxide.

The compositions of the present invention can be prepared by admixing an aqueous dispersion of the fluorinated polymeric material with a previously prepared precoated filler dispersion under high speed agitation such as a high speed disperser at about 3000 to about 5000 RPM for about 10 to about 15 minutes. When a filler dispersion is prepared just prior to use relatively low speed agitation of about 100 RPM can be employed. The filler dispersion in turn should then be obtained under high speed agitation such as a high speed dispersion at about 3000 to about 5000 RPM for about 10 to about 15 minutes. The high speed disperser disperses the coated silica and/or quartz filler and deagglomerates the particles.

The composition is then coated onto a suitable substrate. This can be done as single sheets on a substrate or a continuous coating on a web type substrate. The coating is to the desired thickness of about 5 microns or higher and normally about 5 microns to about 100 microns, and preferably about 13 to about 75 microns thick.

After the coating of the composition onto a substrate to the desired thickness, the coating is baked to volatize surfactant when present at a temperature of about 260° to about 320° C. and preferably about 300° C. to about 320° C. Then the layer is fused at a temperature of about 350° C. to about 400° C. and preferably at about 380° to about 390° C. Prior to the removal of surfactant, if desired, the water from the composition can be removed by heating at about 100° C. for about 1 to about 30 minutes. The heating to remove surfactant is from about 0.25hour to about 2 hours and preferably about 1 hour. The heating to cause the fusion or densification of the composition is usually for about 30 to about 120 minutes and generally carried out under pressure such as about 1000 to about 2000 PSI and preferably about 1700 to about 2000 PSI.

At this point, the substrate if desired can be removed such as by etching to provide a free-standing film of the fluorinated polymeric material and filler. Typical substrates employed in the process include copper and copper/INVAR/copper composites. Such substrates are usually about 17 to about 1000 microns thick and preferably about 17 to about 75 microns thick. When copper or copper composites are employed, such can be removed from the fluorinated polymeric composite by etching in a typical copper etchant such as cupric chloride.

With respect to those compositions that employ surfactants and a pH adjustor, prior to the fusing and densification step, and after the water is removed, the composition is heated to a temperature of about 260° to about 320° C., typical of which is about 280° C. for about 0.25 to about 2 hours, followed by about 320° C. for about 1 hour in order to remove the surfactant and the pH adjustor. Suitable surface active agents that can be employed include non-ionic surface active agents. A preferred surface active agent is octylphenoxyethanol commercially available under the trade designation TRITON X-100 from Rohm and Haas.

Other preferred surface active agents include a series of polyoxyethylene/polyoxypropylene block copolymers commercially available under the trade designation PLURONIC by BASF Inc. (PLURONIC P104, PLURONIC 31R1, PLURONIC F127).

In addition, the compositions should be free from flocculating agents such as those required in U.S. Pat. No. 4,849,284.

The compositions prepared pursuant to the present invention can be subjected to drilling or punching including laser drilling to provide desired vias in the substrate. The laser drilling is carried out with the coating facing the laser and employing various lasers with wavelengths from UV to IR region with 308 nanometers being preferred and a fluence between about 4 to about 20 joules/cm$^2$ (at 308 nm), typically about 8 joules/cm$^2$ employing a noble gas-halide laser such as xenon chloride. The laser drilling can either be the contact or projection type. In order to provide vias in predetermined areas, a laser resistant coating such as copper or copper/INVAR/copper can be provided on the substrate over those areas where holes are not to be provided.

When laser drilling is employed, it is preferred to include in the composition a polyimide to provide UV sensitization for the laser drilling process. Typical amounts of such are about 0.1 to about 5 weight % based upon the weight of the filler. A typical polyimide is Thermid FA 7001, a soluble, fully imidized (or preimidized) polyimide, available from National Starch and Chemical Corp.

The vias produced by punching or drilling in the materials of the present invention are free from fibrous materials and are of extremely good quality.

Typical composites employing compositions of the present invention include copper-dielectric-copper, produced by placing 2 sheets of material coating side to coating side, or copper-dielectric-copper/invar/copper-dielectric-copper by surrounding a copper/INVAR/copper plane by coated copper substrates.

The following examples are presented to further illustrate the present invention.

EXAMPLE 1

Preparation of Coated Filler

About 12 grams of 1H,1H,2H,2H-perfluorooctyltriethoxysilane are mixed into about 100 grams of high purity isopropyl alcohol. About 300 grams of amorphous silica (4910 silica from PQ Corp.) are slowly added to the silane/isopropyl alcohol composition until all of the silica is wetted. The composition is then mixed using high speed stirring for about 15 minutes to provide a slurry. The obtained slurry is then poured into shallow pans for drying. The slurry is air dried overnight. The resulting material is then broken up into smaller particles and dried for about 2 hours at about 125° C. The coated silica is then passed through sieves having a mesh size of about 40 microns.

The coated silica particles have about 4% by weight of the fluorosilane based upon the weight of the silica.

EXAMPLE 2

After 8 grams of PLURONIC 104 surfactant and about 3 grams of PLURONIC 31-R-1 surfactant are admixed into about 190 grams of deionized water using an ordinary laboratory stirrer until all of the solids are dissolved, the foam is permitted to dissipate. Using a homogenizing mixer of 700 RPM, about 7.5 gm. of a solution containing about 30 gm. of Thermid FA 7001 and about 70 gm. of xylene are added.

Next using a high speed disperser at 1000 RPM are dispersed about 300 grams of coated silica prepared in accordance with Example 1. The silica is added over a period of about 15 minutes. After the addition of the silica, the speed of the disperser is increased to about 5000 RPM and mixing is continued for about 15 minutes. About 5 grams of 28% ammonium hydroxide are then added with mixing employing a homogenizing mixer. About 500 grams of 60% solids dispersion of polytetrafluoroethylene (TEFLON 30) are added with stirring for about 10 minutes. About another 20 grams of Pluronic F127 are slowly added with stirring and the stirring is continued until the surfactant is dissolved.

This composition can be saved and stored for later use, or coated immediately as discussed below.

To provide a coating on a single sheet of copper, a 40 cm long sheet of TC/TC treated copper foil (30 microns thick and 30–36 cm wide) available from Gould Inc., Foil Division is placed on the coating bed of an RK Print Coat Instruments, Ltd., laboratory coater. A number 55 wire wound bar is installed on the coater and the gap between the wire wound bar and the substrate is adjusted to 75 microns. Approximately 20 cc. of the coating composition is placed on the copper surface near the coating head. The coating head is activated to coat the copper substrate. The coating is allowed to air-dry to facilitate handling, and then any remaining water is removed by baking at 100° C. for 30 minutes. Such coatings will be approximately 64 to 75 microns thick.

For a continuous roll-to-roll coating, a roll of the above disclosed copper foil is used with a web type production coater equipped with an extrusion head and equipped with heaters which remove the water from the coating and allow the coated copper to be rerolled. Single sheets coated in the laboratory, or sheets of any length may be cut from the roll and subjected to the remainder of the process.

Surfactants in the coating are volatilized by heating the coating in an oven for 120 min. at 280° C. and then 60 min. at 320° C.

The coating composition is densified (fused) under elevated pressure (1700 psi) through a temperature cycle of room temperature to 387° C. and back to room temperature over a time period of 155 minutes. (Exposure to 387° C. is for 30 minutes). Following densification (fusing) of the fluoropolymer, circuitry may then be etched in the copper surfaces or they may be completely etched away to produce free standing films or composites.

Following is a discussion of the tests performed which show the improvement achieved by the present invention.

In several of these tests, a free-standing film of the dielectric is used. Two sheets of copper on which the composition has been coated are placed coating-to-coating, and subjected to the densification (or fusing) process described above. The copper on both sides of the copper/dielectric/copper composite is then etched to provide a free-standing film, with a thickness of about 64 to 74 micrometers.

Percent Elongation

Strips 5 mm wide are cut from free-standing films of the densified dielectric. A gauge length is marked and measured in the middle of the sample. The ends of the sample are clasped and the sample is pulled in the tensile mode. To determine the percent elongation, the gauge length is measured at the break point and compared to the original gauge length.

Porosity by AC Impedance

The copper from one side of a copper/dielectric/copper composite is etched clean. A test cell is placed on the dielectric which allows electrolyte solution to contact a controlled area of dielectric surface. An electric potential is applied between the copper on the back of the composite and an electrode in the solution contacting the dielectric. Pores through the film are capable of conducting current and producing a shift from pure capacitive behavior to resistive (i.e. current carrying) behavior. These shifts are evident in the log of AC impedance; larger values indicative of better capacitance, smaller values of current conduction. The addition of surface active agents to the electrolyte solution accelerate wetting of the pores in the dielectric and result in greater decreases in the log impedance value.

Porosity by Sodium Ion Diffusion

A free-standing dielectric film is placed (like a membrane) between the two halves of a liquid cell which allows contact of liquid in each part with a controlled area of dielectric surface. One part of the cell contains a known high concentration of alkali solution, the other a "just detectable" concentration of the same alkali and a specific ion electrode capable of detecting changes in concentration. Pores in the dielectric allow the highly concentrated alkali to diffuse through the film, resulting in changes in concentration in the detection cell. The time to break through (or for the concentration to increase) is monitored as a measure of porosity or availability of pathway through the dielectric.

Tan Phi (Dielectric Loss)

Holes are drilled in copper/dielectric/copper composites, and samples are placed in boiling water for several hours. Samples are dried off and the dielectric loss immediately determined at frequencies of 200 Hz and 10 KHz. Higher values signify greater electrical leakage (current conduction) due for example, to absorbed moisture.

TEST RESULTS ACHIEVED -
SILICA WITH FLUOROSILANE COATING
PURSUANT TO THE PRESENT INVENTION

| Percent Elongation | 500% | |
|---|---|---|
| Porosity by AC Impedance |Z| | | Log Z |
| Electrolyte with surfactant | 0.5 hrs. | 10.7 |
| | 21 hrs. | 10.1 |
| Porosity by Sodium Ion Diffusion Time to Breakthrough | >72 hrs. | |
| Tan Phi (Dielectric Loss, D) | 0.045 | |

COMPARISON EXAMPLE 3

Example 2 is repeated except that the silica employed is not precoated with the fluorosilane. The results obtained are as follows:

TEST RESULTS ACHIEVED - SILICA WITHOUT
FLUOROSILANE COATING PURSUANT
TO THIS COMPARISON EXAMPLE

| Percent Elongation | 120% | |
|---|---|---|
| Porosity by AC Impedance |Z| | | Log Z |
| Electrolyte with surfactant | 0.5 hrs. | 4.25 |
| (Test discontinued at 3 hrs.) | 3 hrs. | 3.87 |
| Porosity by Sodium Ion Diffusion Time to Breakthrough | 3 hrs. | |
| Tan Phi (Dielectric Loss, D) | >10 | |

What is claimed is:

1. A process for fabricating a layer having vias which comprises:

A. obtaining a composition containing a (1) fluorinated polymeric material; (2) a silica filler wherein said filler is coated with a fluorosilane having groups that are reactive with groups on said filler, wherein said reactive groups are chloro or alkoxy groups or mixtures thereof wherein said filler has a mean particle size of no greater than about 7 μm; and
        wherein the amount of fluorinated polymeric material is about 50 to about 90 weight percent, and the amount of filler is about 50 to about 10 weight percent; based upon the total of fluorinated polymeric material and filler; and
    a polyimide in an amount effective for enhancing laser drillability;
    B. applying said composition to a substrate; and then
    C. heating the composition to a temperature of about 350° C. to about 400° C.; and then
    D. forming vias in said layer by laser drilling.

2. The process of claim 1 which contains about 0.1 to about 5 weight % of a polyimide based upon the weight of the filler.

3. The process of claim 1 wherein said silica includes quartz.

4. The process of claim 1 wherein said fluorosilane is selected from the group consisting of 1H, 1H, 2H, 2H perfluorooctyl-triethoxysilane; 1H, 1H, 2H, 2H perfluoroalkyltriethoxysilane; (-tridecafluoro 1,1,2,2-tetra-hydrooctyl)-1-dimethylchlorosilane; (3,3,3-trifluoropropyl) trimethoxysilane; and mixtures thereof.

5. The process of claim 1 wherein the amount of fluorosilane is about 0.2 to about 10% by weight based upon the weight of said filler.

6. The process of claim 1 wherein said heating is carried out under pressure of about 1000–2000 psi.

7. The process of claim 1 wherein said layer is at least about 13 microns thick.

8. The process of claim 1 wherein said composition contains water and surfactant and which further includes prior to heating said composition in C., heating to remove water followed by heating to about 260° C. to about 320° C. for about 1 to 2 hours to remove surfactant present in the composition.

9. The process of claim 1 wherein the fluorinated polymeric material is selected from the group consisting of polymer of tetrafluoroethylene, copolymer of tetrafluoroethylene and perfluoro-2,2-dimethyl-1,3-dioxide, copolymer of tetrafluoroethylene and hexafluoropropylene, fluorinated ethylene-propylene copolymer and mixtures thereof.

10. The process of claim 1 wherein said layer has a dielectric constant less than about 3.2.

11. The process of claim 10 wherein the pH of the composition during said process is about 8 to about 11.

12. The process of claim 11 wherein said pH is about 9 to about 9.5.

13. The process of claim 1 wherein said composition contains volatile constituents which further includes preheating the composition to a temperature of up to 320° C. prior to the heating in C for volatilizing of volatile constituents contained in said composition.

* * * * *